(12) United States Patent
Crabill

(10) Patent No.: US 6,292,020 B1
(45) Date of Patent: Sep. 18, 2001

(54) LOW-SKEW PROGRAMMABLE CONTROL ROUTING FOR A PROGRAMMABLE LOGIC DEVICE

(75) Inventor: Eric J. Crabill, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/630,034

(22) Filed: Aug. 1, 2000

(51) Int. Cl.⁷ .......................... H03K 19/177; H01L 25/00
(52) U.S. Cl. ................................ 326/41; 326/41; 326/38; 326/47
(58) Field of Search .................. 326/38, 39, 40, 326/41, 47

(56) References Cited

U.S. PATENT DOCUMENTS

| | | |
|---|---|---|
| 4,642,487 | 2/1987 | Carter . |
| 5,296,759 * | 3/1994 | Sutherland et al. .............. 307/465.1 |
| 5,298,805 * | 3/1994 | Garverick et al. .................... 307/465 |
| 5,712,579 * | 1/1998 | Doung et al. ........................ 326/39 |
| 6,064,225 * | 5/2000 | Andrews et al. ...................... 326/41 |

OTHER PUBLICATIONS

Xilinx Advance Product Specification, "Virtex–E 1.8 V Extended Memory Field Programmable Gate Arrays", DS025 (v1.0) Mar. 23, 2000, pp. 1–19.

* cited by examiner

Primary Examiner—Michael Tokar
Assistant Examiner—Vibol Tan
(74) Attorney, Agent, or Firm—Arthur J. Behiel

(57) ABSTRACT

Described are programmable routing resources capable of distributing low-skew signals along more than one edge of a programmable logic device (PLD). The PLD includes groups of input/output blocks (IOBs) arranged along each edge. A programmable signal-distribution tree can be configured to send a shared, low-skew signal to IOBs along adjacent edges. These signals are conveyed via perpendicular conductive lines that run parallel to the respective edges. Each conductive line can be programmably connected to a source of the shared signal using a respective programmable-interconnect point located near the corner of the PLD defined by the two edges.

17 Claims, 4 Drawing Sheets

LOW-SKEW PROGRAMMABLE CONTROL ROUTING FOR A PROGRAMMABLE LOGIC DEVICE

FIELD OF THE INVENTION

The invention relates to programmable routing resources for programmable logic devices.

BACKGROUND

Programmable logic devices (PLDs) are a well-known type of integrated circuit that may be programmed by a user (e.g., a circuit designer) to perform specified logic functions. One type of PLD, the field-programmable gate array (FPGA), can implement thousands of gates of logic on a single integrated circuit. PLDs, including FPGAs, are becoming ever more popular, largely because they require less time to implement than semi-custom and custom integrated circuits.

FIG. 1 (prior art) depicts a conventional FPGA 100. As is typical, FPGA 100 includes an array of configurable logic blocks (CLBs) 105 that are programmably connected to each other and to programmable input/output blocks (IOBs) 110. CLBs 105 include memory arrays that can be configured either as look-up tables (LUTs) that perform specified logic functions or as random-access memory (RAM). Some modern FPGAs also include embedded blocks of RAM 115 optimized for memory applications. Configuration data loaded into internal configuration memory cells (not shown) define the operation of the FPGA by determining how the CLBs, interconnections, block RAM, and IOBs are configured. FPGA 100 may be, for example, a Virtex™ FPGA available from Xilinx, Inc., of San Jose, Calif. For a more detailed description of a Virtex™ FPGA, see "Virtex™-E 1.8 V Extended Memory Field Programmable Gate Arrays," advance product specification, DS025 (v1.0) Mar. 23, 2000, pages 1–19, which is available from Xilinx, Inc., and is incorporated herein by reference.

FIG. 2 (prior art) depicts another view of FPGA 100 of FIG. 1, like-numbered elements being the same. A majority of CLBs 105 and IOBs 110 are omitted for simplicity. A pair of CLBs 105A and 105B represents two signal sources, each intended to drive a shared signal to a plurality of IOBs 110. Referring first to the left-hand side of FPGA 100, CLB 105A connects to a vertical interconnect line 200 via a buffer 205 and a programmable interconnect point (PIP) 210A. PIP 210A is one of a collection of conventional PIPs used to programmably connect various horizontal and vertical conductors to define desired signal paths. For illustrative purposes, programmed PIPs and the associated signal paths are depicted in FIG. 2 using relatively wide lines.

FPGA 100 is configured such that CLB 105A provides a shared signal S to a series of IOBs 110, the series collectively designated 215. Such configurations are typical when implementing communication channels (e.g., input or output busses) in which a collection of IOBs 110 share common signals, such as clock, clock-enable, write-enable, output-enable, preset and clear signals, to name just a few. In this specification, the IOBs connected to CLB 105A or CLB 105B are designated as "⊠", and the unused IOBs are empty boxes.

The common signal S from CLB 105A traverses different lengths of interconnect lines, depending upon the destination. Consequently, signal S arrives at the various IOBs 110 within series 215 at slightly different times. This difference, conventionally known as "skew," can be a significant problem when attempting to synchronously send or receive relatively fast signals in parallel. For example, it can be very difficult to control a number of IOBs 110 in parallel, as is required to implement a control channel. This problem is exacerbated when the control signal S has both minimum and maximum delay constraints.

In general, the greater the number and separation of signal destinations that must be synchronized, the greater the skew problem. This is particularly true when signals must be routed to IOBs along more than one edge, a situation illustrated on the right-hand side of FIG. 2. In that example, the number of IOBs 110 along the right-hand edge is insufficient to implement a desired synchronous communication channel. Thus, two IOBs 110 from the upper edge of FPGA 100 are joined with a collection of IOBs 110 along the right-hand edge. Unfortunately, wrapping the synchronized signal from signal source 105B around a corner using the conventional interconnect scheme of FIG. 2 exacerbates the skew problem by requiring the inclusion of a group of additional PIPs and interconnect conductors 220. The resulting additional skew can cause FPGA 100 to fail to meet a required timing specification, possibly leading to timing errors. There is therefore a need for improved programmable routing resources capable of distributing low-skew signals along more than one edge of a programmable logic device.

SUMMARY

The present invention is directed to an improved programmable routing resource capable of distributing low-skew signals along more than one edge of a programmable logic device (PLD). PLDs conventionally include a first group of IOBs arranged along a first edge of the PLD and a second group of IOBs arranged along a second edge of the PLD. A PLD in accordance with the invention conveys shared signals to both groups of IOBs from an area near the corner of the PLD defined by the meeting of the first and second edges.

In one embodiment, the first group of IOBs connects to the signal source via a first conductive segment (e.g., a metal line) disposed in parallel with the first edge, and the second group of IOBs connects to the signal source via a second conductive segment disposed in parallel with the second edge. An interconnect segment extends from the signal source toward the area near the corner defined by the first and second edges. In this context, an area is "near" a given corner if the area is physically closer to the given corner than to the remaining corners. A pair of PIPS in the corner area selectively connects the interconnect segment to one or both of the first and second conductive segments. Distributing signals shared by the first and second groups of IOBs from a point between the groups minimizes skew between the various IOBs.

Each of the first and second conductive segments extends only part-way along the length of the corresponding edge. Each edge therefore includes an additional conductive segment that extends along the remaining portion. The additional segment allows shared signals to be provided to those IOBs not available to the first and second conductive segments. These additional segments can be connected to signal sources via an interconnect line that extends to an area of the PLD near a second corner adjacent to the first corner. Shared signals are thus conveyed along the edges of the PLD from the corners, an arrangement that reduces the amount of skew between IOBs on different edges. IOBs and interconnect resources similar to those described above are laid out along the remaining two edges of the PLD.

IOBs often require more than one synchronous signal. A PLD in accordance with one embodiment of the invention therefore includes a number of signal-distribution networks similar to the one described above.

This summary does not purport to define the invention. The invention is defined by the claims.

DETAILED DESCRIPTION

Figure 1:
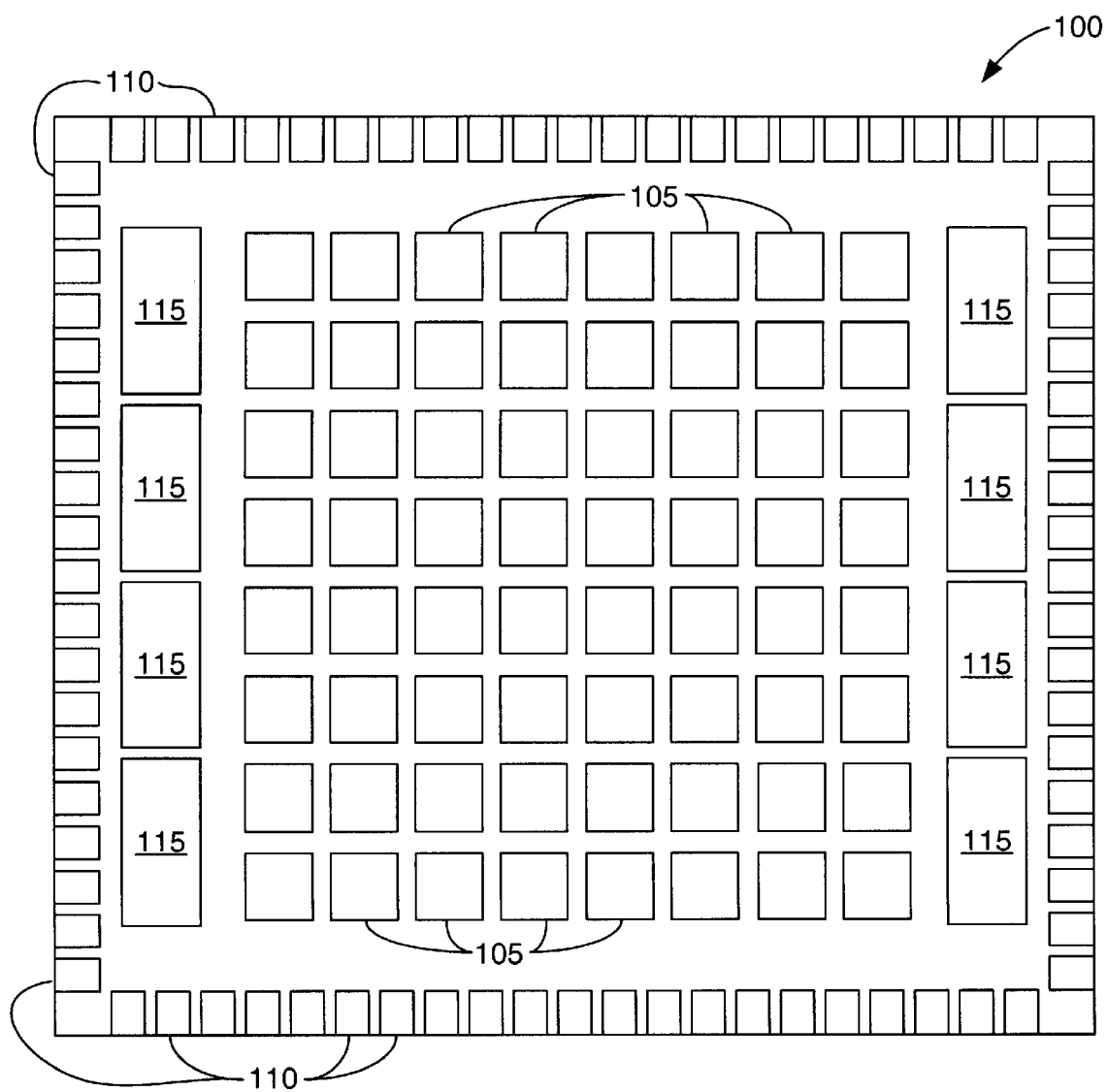
FIG. 1 (prior art) depicts a conventional FPGA 100.
Figure 2:
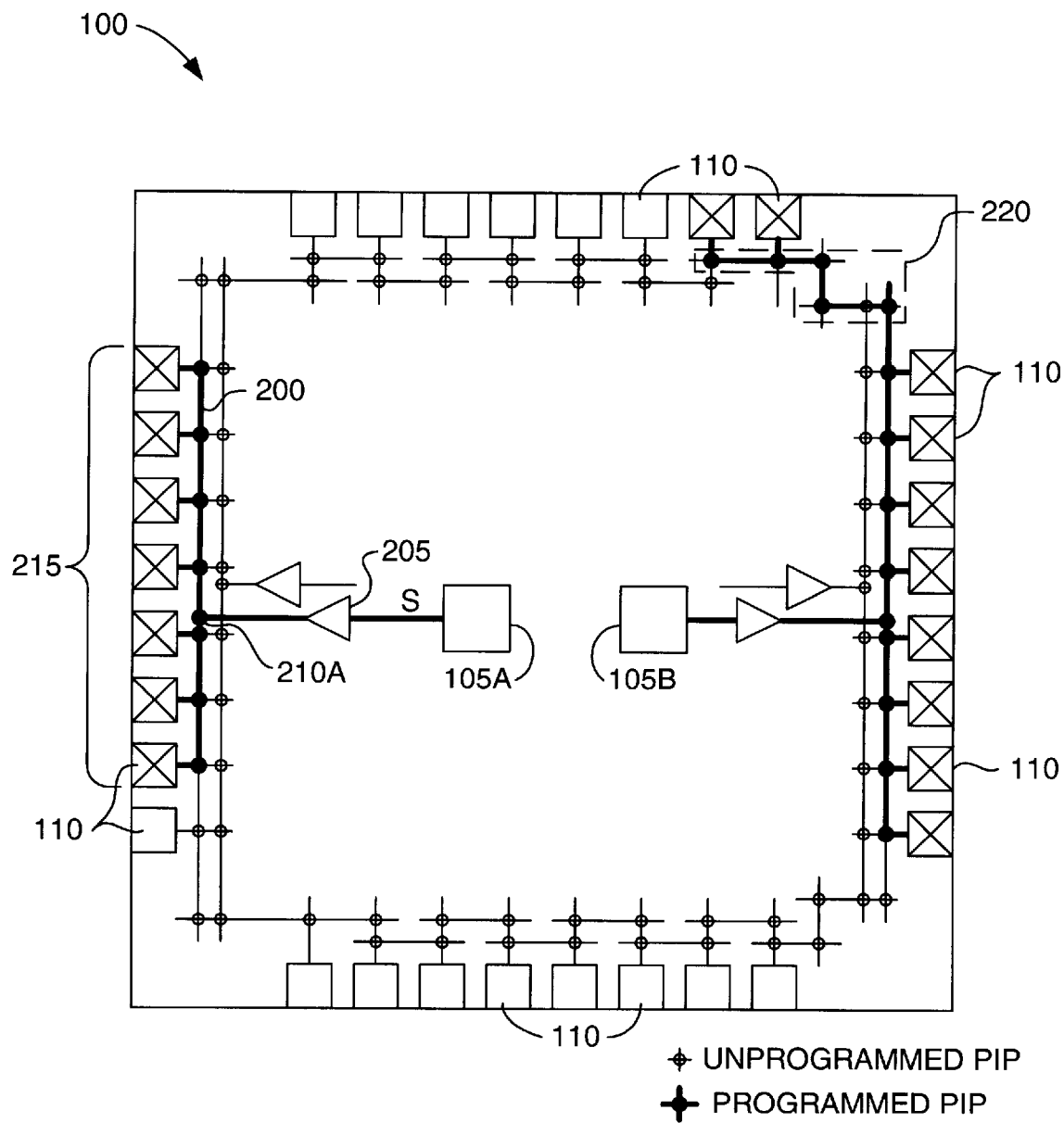
FIG. 2 (prior art) depicts another view of FPGA 100 of FIG. 1, like-numbered elements being the same.
Figure 3:
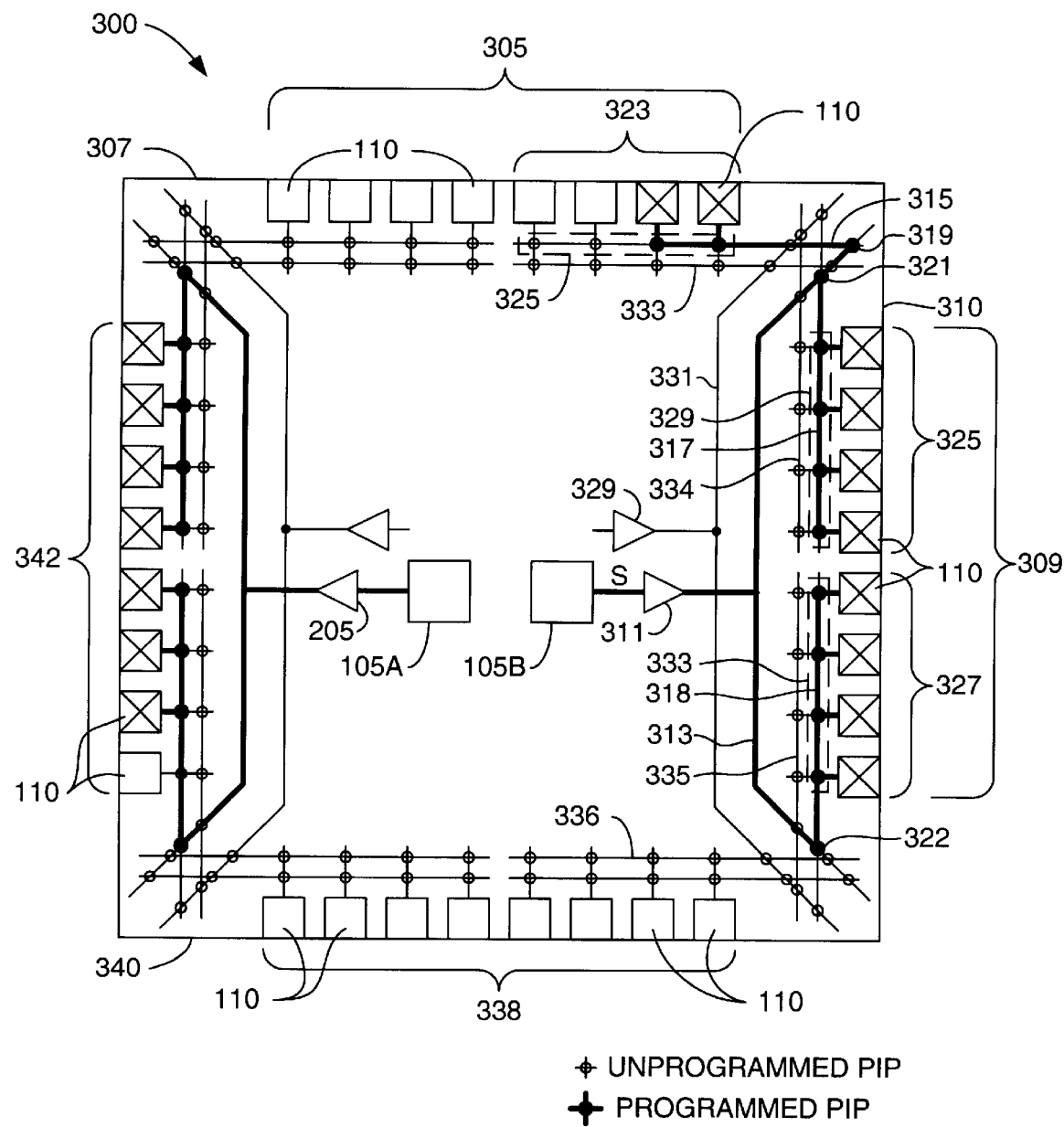
FIG. 3 depicts an FPGA 300 having programmable routing resources capable of delivering low-skew signals to IOBs arranged along more than one edge.

FIG. 3 depicts an FPGA 300 having programmable routing resources capable of delivering low-skew signals to IOBs arranged along more than one edge. FPGA 300 is similar to FPGA 100 of FIGS. 1 and 2, like-numbered elements being the same. As with FIG. 2, a majority of CLBs 105 and IOBs 110 are omitted for simplicity.

The following discussion focuses on how FPGA 300 can be routed so that one or more IOBs selected from a first group 305 disposed along a first edge 307 of FPGA 300 can be combined with IOBs selected from a second group 309 disposed along a second edge 310. The ability to synchronize IOBs from more than one edge enables circuit designers to create high-performance communication channels that have more signal paths than there are IOBs 110 on any one edge of FPGA 300.

A CLB 105B produces an exemplary signal S—on a like-named line—that is distributed to each IOB 110 to be used in the communication channel. CLB 105B distributes signal S through a programmable signal-distribution tree that includes a buffer 311, an interconnect line 313, a first conductive segment 315, a second conductive segment 317, and a third conductive segment 318. The signal-distribution tree can have more or fewer components. Interconnect line 313 selectively connects to each of the first, second, and third conductive segments 315, 317, and 318 via respective PIPs 319, 321, and 322. In the depicted embodiment, conductive segment 318 is collinear with conductive segment 317, which is to say that segments 317 and 318 have the same horizontal coordinate.

Conductive segment 315 can be programmably connected to one or more of a group of IOBs 323 via a first collection of conventional PIPs 325. Likewise, conductive segment 317 can be programmably connected to one or more of a group of IOBs 325 via a second collection of PIPs 329, and conductive segment 318 can be programmably connected to one or more of a consecutive sequence of IOBs 337 via a third collection of PIPs 333. This configuration allows the user to route signal S from buffer 311 to any IOB 110 within consecutive sequences 323, 325, and 327, as well as to the four right-most IOBs 110 across the bottom edge of FPGA 300 (shown not routed in FIG. 3).

The various PIPs of FIG. 3 are conventional. For a more detailed treatment of PIPs for use in accordance with the present invention, see U.S. Pat. No. 4,642,487 to William S. Carter, issued Feb. 10, 1987, and incorporated herein by reference.

Conductive segment 315 extends only part way across the first edge 307 of FPGA 300, because extending segment 315 all the way across FPGA 300 will require segment 315 to be of a length that may produce an unacceptable skew. Thus, segment 315 can only connect to one or more of IOBs 110 in the consecutive sequence of IOBs 323. Similarly, segment 317 can only connect to one or more IOBs in a consecutive sequence of IOBs 325, and segment 318 can only connect to one or more IOBs in a consecutive sequence 327. To minimize the signal path length from CLB 105B, one of the IOBs in sequence 323 is the IOB closest to the second edge 310, one of the IOBs in sequence 325 is the IOB closest to the first edge 307, and one of the IOBs in sequence 327 is the IOB farthest from the first edge 307. In each sequence 323, 325, and 327, the IOB physically closest to the neighboring edge is electrically closer to the signal source (e.g., buffer 311) than the other of the IOBs in the respective sequence. This arrangement provides reduced skew as compared to the arrangement depicted in FIG. 2.

In the depicted embodiment, each IOB 110 on the right-hand side of FPGA 300 can be programmed to connect to interconnect line 313 by programming just two PIPs. This holds true whether the signal-distribution tree distributes shared signals to IOBs arranged along one, two, or three edges of FPGA 300. The signal skew between the various IOBs is therefore minimal. This is in contrast to the conventional configuration of FIG. 2, in which additional interconnect resources 220 (PIPs and interconnect conductors) are connected to include IOBs from the top edge.

IOBs often require more than one synchronous signal. FPGA 300 therefore includes a number of signal-distribution trees similar to the one described above. In FIG. 3, for example, a second signal-distribution tree includes a buffer 329, an interconnect line 331, and four conductive segments 333, 334, 335, and 336. Interconnect line 331 selectively connects to a number of IOBs 110 via conductive segments 333–336 using a number of PIPs of the type described above. Additional signal distribution trees can be added as needed.

In the depicted example, the signal-distribution trees of FPGA 300 are vertically and horizontally symmetrical. For example, the collection of IOBs 110 designated 305 is identical to a collection of IOBs 110 designated 338 and located along a third edge 340 of FPGA 300, and the collection of IOBs 110 designated 309 is identical to a collection of IOBs 110 designated 342 and located along a fourth edge of FPGA 300. The preceding description applies equally to the mirror-image structures depicted in FIG. 3; a discussion of the mirror-image structures is therefore omitted for brevity.

Figure 4:
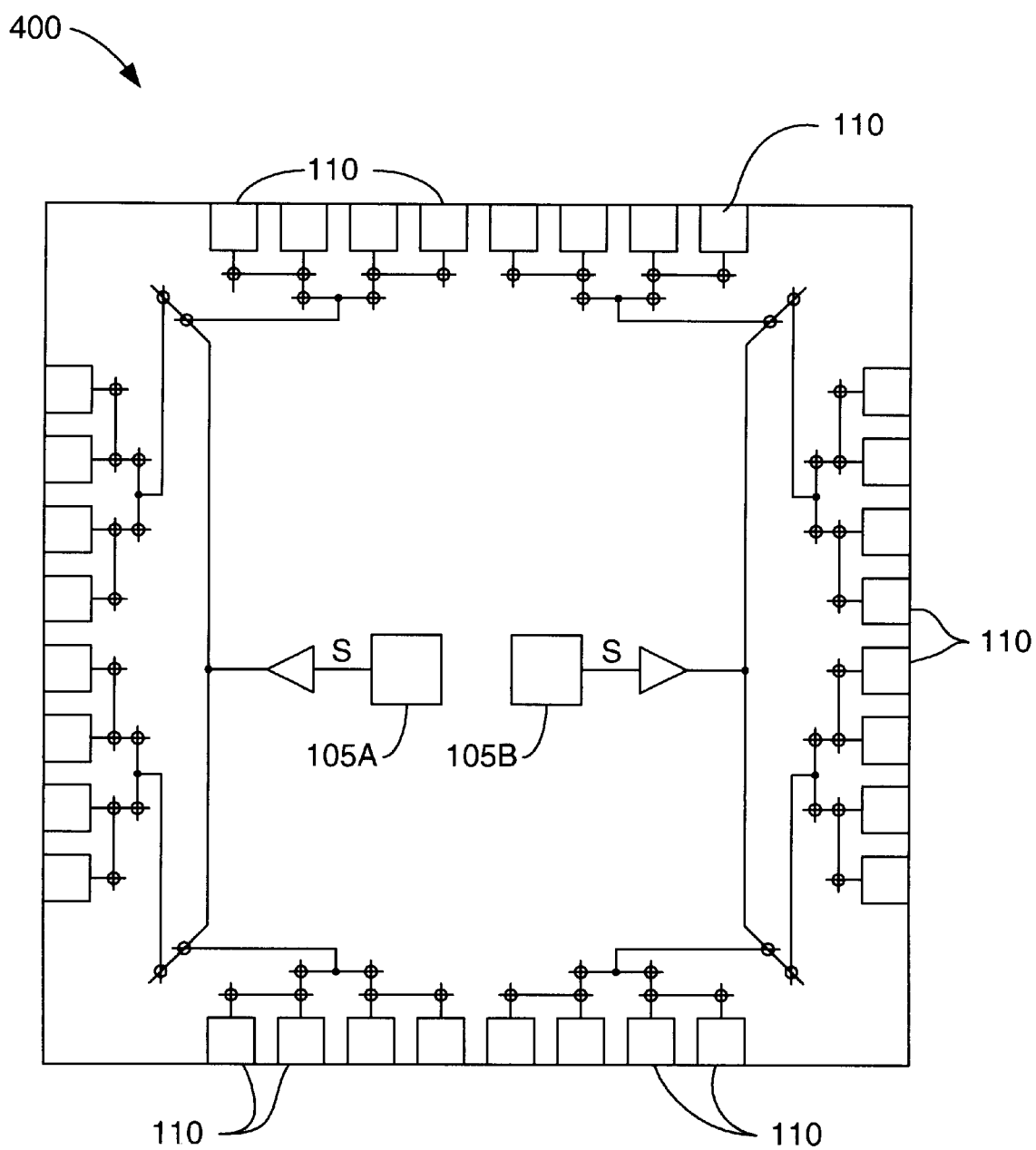
FIG. 4 depicts an FPGA 400 that, like FPGA 300 of FIG. 3, includes programmable routing resources capable of delivering low-skew signals to IOBs arranged along more than one edge.

FIG. 4 depicts an FPGA 400 that, like FPGA 300 of FIG. 3, includes programmable routing resources capable of delivering low-skew signals to IOBs arranged along more than one edge. FPGA 400 is similar to FPGA 300 of FIG. 3. FPGA 400 illustrates that signal trees in accordance with the invention can be modified as desired to obtain a desired balance of complexity, signal propagation delay, and skew. Still other embodiments will be evident to those of skill in the art.

While the present invention has been described in connection with specific embodiments, variations of these embodiments will be obvious to those of ordinary skill in the art. For example, the layout of the signal-distribution trees in FIGS. 3 and 4 can be rearranged in myriad ways to accommodate the needs of a given design. Many such modifications will be obvious to those of skill in the art. Therefore, the spirit and scope of the appended claims should not be limited to the foregoing description.

What is claimed is:

1. A programmable logic device (PLD), comprising:
   a. a first plurality of IOBs arranged along a first edge of the PLD;
   b. a second plurality of IOBs arranged along a second edge of the PLD, wherein the second edge is arranged substantially perpendicular to the first edge, thereby forming a first corner joining the first and second edges; and
   c. a programmable signal-distribution tree including:
      i. a signal source having a signal-source output terminal;
      ii. a first conductive segment disposed in parallel with the first edge;
      iii. a first programmable interconnect point (PIP) adapted to selectively connect the signal-source output terminal to the first conductive segment;
      iv. a first group of PIPs adapted to selectively connect each of a first consecutive sequence of the first plurality of IOBs to the first conductive segment, wherein one of the first consecutive sequence of IOBs is the IOB closest to the second edge;
      v. a second conductive segment disposed in parallel with the second edge;
      vi. a second PIP adapted to selectively connect the signal-source output terminal to the second conductive segment; and
      vii. a second group of PIPs adapted to selectively connect each of a second consecutive sequence of the second plurality of IOBs to the second conductive segment, wherein one of the second consecutive sequence of IOBs is the IOB closest to the first edge.

2. The PLD of claim 1, the programmable signal-distribution tree further comprising:
   a. a second signal source having a second signal-source output terminal;
   b. a third conductive segment disposed in parallel with the first conductive segment;
   c. a third PIP adapted to selectively connect the second signal-source output terminal to the third conductive segment; and
   d. a third group of PIPs adapted to selectively connect each of the first consecutive sequence of the first plurality of IOBs to the third conductive segment.

3. The PLD of claim 2, the signal-distribution tree further comprising:
   a. a fourth conductive segment disposed in parallel with the second conductive segment;
   b. a fourth PIP adapted to selectively connect the second signal-source output terminal to the fourth conductive segment; and
   c. a fourth group of PIPs adapted to selectively connect each of the second consecutive sequence of the first plurality of IOBs to the fourth conductive segment.

4. The PLD of claim 1, further comprising:
   a. a third conductive segment disposed collinearly with the second conductive segment;
   b. a third PIP adapted to selectively connect the signal-source output terminal to the third conductive segment; and
   c. a third group of PIPs adapted to selectively connect each of a third consecutive sequence of the second plurality of IOBs to the third conductive segment.

5. The PLD of claim 4, wherein the third consecutive sequence of the second plurality of IOBs includes the IOB in the second plurality of IOBs farthest from the first edge.

6. The PLD of claim 5, wherein not one IOB selected from among the second consecutive sequence of IOBs is an IOB selected from among the third consecutive sequence of IOBS.

7. The PLD of claim 6, wherein each of the second and third consecutive sequences of IOBs includes an equal number of IOBs.

8. The PLD of claim 1, further comprising:
   a. a third plurality of IOBs arranged along a third edge of the PLD, wherein the third edge is arranged substantially perpendicular to the second edge, thereby forming a second corner joining the second and third edges; and
   b. a fourth plurality of IOBs arranged along a fourth edge of the PLD, wherein the fourth edge is arranged substantially perpendicular to the first and third edges, thereby forming a third corner joining the third and fourth edges and a fourth corner joining the fourth and first edges.

9. The PLD of claim 8, the signal-distribution tree further comprising:
   a. a third conductive segment disposed in parallel with the third edge;
   b. a third PIP adapted to selectively connect the signal-source output terminal to the third conductive segment; and
   c. a third group of PIPs adapted to selectively connect each of a third consecutive sequence of IOBs selected from the third plurality of IOBs.

10. The PLD of claim 9, wherein one of the third consecutive sequence of the third plurality of IOBs is the IOB closest to the second edge.

11. The PLD of claim 1, wherein the one of the first consecutive sequence of IOBs closest to the second edge is electrically closer to the signal source than the other of the first consecutive sequence of IOBs.

12. The PLD of claim 11, wherein the one of the second consecutive sequence of IOBs closest to the first edge is electrically closer to the signal source than the other of the second consecutive sequence of IOBs.

13. The PLD of claim 1, wherein the number of PIPs required to connect any one of the first consecutive sequence of the first plurality of IOBs to the signal-source output terminal is the same as the number of PIPs required to connect each of the second consecutive sequence of the second plurality of IOBs to the signal-source output terminal.

14. The PLD of claim 1, wherein the PLD is a field-programmable gate array.

15. A programmable logic device (PLD), comprising:
   a. a first plurality of IOBs arranged along a first edge of the PLD;
   b. a second plurality of IOBs arranged along a second edge of the PLD, wherein the second edge is arranged substantially perpendicular to the first edge, thereby forming a first corner joining the first and second edges; and
   c. a programmable signal-distribution tree including:
      i. a signal source having a signal-source output terminal;
      ii. a collection of conductors extending between the signal source and each IOB of the first and second pluralities of IOBs; and
      iii. a collection of programmable interconnect points (PIPs) adapted to selectively interconnect the signal-source output terminal to each IOB in the first and second plurality of IOBs via at least one of the collection of conductors;

iv. wherein connecting the IOB among the first plurality of IOBs closest to the second edge requires programming a number of the PIPs; and v. wherein connecting the IOB among the second plurality of IOBs closest to the first edge requires programming the same number of PIPs.

16. The PLD of claim 15, wherein connecting the IOB among the second plurality of IOBs farthest from the first edge requires programming the same number of PIPs.

17. The PLD of claim 15, wherein connecting a second IOB among the first plurality of IOBs requires programming a second number of PIPs different from the first-mentioned number of PIPs.

\* \* \* \* \*